(12) United States Patent
Han et al.

(10) Patent No.: US 7,365,367 B2
(45) Date of Patent: Apr. 29, 2008

(54) ORGANIC ELECTROLUMINESCENT DEVICE HAVING SLOPED BANKS AND COATING FABRICATION TECHNIQUE

(75) Inventors: Chang-Wook Han, Seoul (KR); Sung-Joon Bae, Gyeonggi-do (KR); Hee-Sok Pang, Gyeonggi-do (KR); Kwan-Soo Kim, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/651,955

(22) Filed: Sep. 2, 2003

(65) Prior Publication Data
US 2004/0119066 A1    Jun. 24, 2004

(30) Foreign Application Priority Data
Nov. 6, 2002    (KR) .................. 10-2002-0068570

(51) Int. Cl.
*H01L 33/00*  (2006.01)
*H01L 35/24*  (2006.01)
*H01L 51/00*  (2006.01)
*H01L 29/04*  (2006.01)

(52) U.S. Cl. ..................... 257/88; 257/40; 257/59; 257/72

(58) Field of Classification Search ............. 257/40, 257/79–100, 59, 72, E51.022

See application file for complete search history.

(56) References Cited

U.S. PATENT DOCUMENTS

| 6,420,834 | B2 * | 7/2002 | Yamazaki et al. ....... 315/169.3 |
| 6,762,552 | B1 * | 7/2004 | Duineveld et al. .......... 313/506 |
| 6,948,993 | B2 * | 9/2005 | Yi et al. ...................... 445/24 |
| 2002/0158835 | A1 * | 10/2002 | Kobayashi et al. ......... 345/100 |
| 2003/0053044 | A1 * | 3/2003 | Popovic et al. ............. 356/218 |
| 2003/0080338 | A1 * | 5/2003 | Yamazaki et al. ........... 257/59 |
| 2003/0166311 | A1 * | 9/2003 | Miyazawa ................... 438/82 |

FOREIGN PATENT DOCUMENTS

| CN | 1353866 A | 6/2002 |
| JP | 11-074082 | 3/1999 |

* cited by examiner

*Primary Examiner*—Shouxiang Hu
(74) *Attorney, Agent, or Firm*—Birch, Stewart, Kolasch & Birch, LLP

(57) ABSTRACT

An organic electroluminescent device includes a transparent substrate having at least first, second and third pixels defined thereon, a first longitudinal bank located between the first pixel and the second pixel, a second longitudinal bank located between the second pixel and the third pixel, and an organic luminous polymer layer over the substrate and between the first longitudinal bank and the second longitudinal bank. The device also includes a transverse bank extending between the first longitudinal bank and the second longitudinal bank. Sidewalls of the longitudinal banks and the transverse bank slope outwardly. The transverse bank has a height which is less than a height of the longitudinal banks. A method of forming the device utilizes nozzle coating or ink-jet coating, and a specially configured mask for producing the banks of differing heights.

39 Claims, 16 Drawing Sheets

ORGANIC ELECTROLUMINESCENT DEVICE HAVING SLOPED BANKS AND COATING FABRICATION TECHNIQUE

This application claims the benefit of Korean Patent Application No. 2002-0068570, filed on Nov. 6, 2002 in Korea, which is hereby incorporated by reference in its entirety for all purposes as if fully set forth herein.

BACKGROUND OF THE INVENTION

1. Field of the Invention

The present invention relates to an organic electroluminescent display device, and more particularly, to a method of forming an organic electroluminescent display device using sloped banks and a nozzle coating technique or ink-jet coating technique.

2. Discussion of the Related Art

An organic electroluminescent display device includes a cathode electrode injecting electrons, an anode electrode injecting holes, and an organic electroluminescent layer between the two electrodes. Namely, an organic electroluminescent diode has a multi-layer structure of organic thin films between an anode electrode and a cathode electrode. When forward current is applied to the organic electroluminescent diode, electron-hole pairs (often referred to as exciton) combine in an organic electroluminescent layer as a result of a P-N junction between the anode electrode, which provides holes, and the cathode electrode, which provides electrons. The electron-hole pairs have a lower energy together when combined than when they were separated. The energy gap between combined and separated electron-hole pairs is converted into light by an organic electroluminescent element. That is, the organic electroluminescent layer emits the energy generated due to the recombination of electrons and holes when a current flows.

As a result of the above principle, the organic electroluminescent device does not need an additional light source as compared to the liquid crystal display device. Also, the electroluminescent device is thin with light weight and high energy efficiency. The organic electroluminescent device has excellent advantages for displaying images, such as a low power consumption, a high brightness, a short response time and a light weight. Due to these advantages, the organic electroluminescent device is adapted to various electronic applications, e.g., mobile communication devices, PDA's (personal digital assistances), camcorders, and palm PC's. Because of the fabricating simplicity when forming the organic electroluminescent devices, the cost of production decreases as compared to the liquid crystal display device.

The driving method of operating the organic electroluminescent display device is classified as a passive matrix type and an active matrix type. The passive matrix type has a simple structure and fabrication process, but has a high power consumption compared to the active matrix type. Further, the passive matrix type is difficult to make large in size and has a decreasing aperture ratio as the bus lines increase.

In contrast, the active matrix type organic electroluminescent device provides a high display quality with high luminosity as compared with the passive matrix type. The core element of the organic electroluminescent display device is an organic electroluminescent (EL) material, such as a low or high molecular weight organic EL material. It is easy to handle the high molecular organic EL material rather than the low molecular weight organic EL material, and the high molecular weight organic EL material has good thermal resistance.

FIG. 1 is a schematic cross-sectional view illustrating an active matrix type organic electroluminescent display device according to the background art.

As shown in FIG. 1, an organic electroluminescent display device 10 includes first and second substrates 12 and 28 which are attached to each other by a sealant 26. On the first substrate 12, a plurality of thin film transistors (TFTs) T and array portions 14 are formed. A first electrode (i.e., an anode electrode) 16, an organic luminous layer 18 and a second electrode (i.e., a cathode electrode) 20 are sequentially formed on and over the TFTs T and the array portion 14. At this point, the organic luminous layer 18 includes red (R), green (G) or blue (B) color in each pixel P and thus each pixel P emits light of red (R), green (G) or blue (B) color. Namely, to show color images, organic color luminous patterns are disposed respectively in each pixel P. Further, the organic luminous layer 18 is formed by patterning or printing color organic material in each pixel P.

Still referring to FIG. 1, the second substrate 28, which is attached to the first substrate 12 by the sealant 26, includes a moisture absorbent 22 on the rear surface thereof. The moisture absorbent 22 absorbs the moisture that may exist in the cell gap between the first and second substrates 12 and 28. When disposing the moisture absorbent 22 in the second substrate 28, a portion of the second substrate 28 is etched to form a recess. Thereafter, the powder-type moisture absorbent 22 is disposed into this recess and then a sealing tape 25 is put on the second substrate 28 to fix the powder-type moisture absorbent 22 into the recess.

In the above-mentioned structure and configuration, a nozzle coating technique, for example, is utilized to form the organic luminous layer. In the nozzle coating technique, separators or banks are used to form the separate red (R), green (G) and blue (B) organic luminous layer. If the major axis of the pixel is defined as a longitudinal direction and the minor axis of the pixel is defined as a transverse direction, the nozzle moves in rectilinear and reciprocating motion along the longitudinal direction to form the color organic EL material, and thus, the organic luminous layer has a linear shape with a desired width. As a result, the pixels that are arranged in the longitudinal direction have the same color EL material together and emit the same light color. Furthermore, the pixels that are arranged in the transverse direction have the red (R), green (G) and blue (B) colors alternately. At this time, longitudinal banks are disposed in the longitudinal direction between the red (R), green (G) and blue (B) organic luminous layers in order to prevent interferences between the red (R) and green (G), green (G) and blue (B), or blue (B) and red (R) EL materials.

The formation of the longitudinal banks is conducted through the photolithography process or the printing process, for example. When the photolithography method is used to form the longitudinal banks, the organic material is first formed over the substrate by spin coating or spray coating and then a photoresist is deposited on the organic material. Thereafter, a mask having the shape corresponding to the longitudinal banks is disposed over the photoresist for the light exposure. After the light exposure through the mask, the exposed photoresist is developed to have the bank shape. Then the organic material is etched to be the longitudinal banks.

FIG. 2 is a schematic plan view illustrating an organic electroluminescent device having longitudinal banks according to the background art. As shown, a plurality of longitudinal banks 50 are disposed in a longitudinal direction. A plurality of pixels 60 are disposed in between the longitudinal banks 50. In each pixel 60, a thin film transistor T and a pixel electrode 57 are located. When forming a color organic luminous layer 62 in between two longitudinal banks 50, a nozzle injecting the organic EL material moves in a longitudinal direction and then the organic EL material is coated over the substrate. At this time, it is quite difficult to make the color organic luminous layer 62 have a uniform thickness and a thickness stability because the nozzle's scan speed and the injecting quantity of organic EL material are very different and variable during the nozzle movement.

FIG. 3 is a schematic perspective view illustrating a nozzle injection for forming a luminous polymer over a substrate between longitudinal banks according to the background art. The plurality of pixels 60 are formed over the substrate 100, and the plurality of longitudinal banks 50 are disposed over the substrate in a longitudinal direction while dividing the longitudinally arranged pixels 60. A nozzle 80 injects a luminous polymer 90 between the longitudinal banks 50. When leveling the luminous polymer 90 after the nozzle injection, the injected luminous polymer 90 streams down from the edge of the substrate 100 that is at the end of a trench between two longitudinal banks 50. Therefore, the thickness of the injected luminous polymer 90 becomes smaller, and leveling the luminous layer 90 is very difficult. Furthermore, the thickness of the luminous layer 90 is not uniform and varies between the longitudinal banks 50 over the substrate 100.

To overcome this problem, the scan speed of the nozzle 80 is sometimes reduced. However, the decrease of scan speed causes overflowing over the longitudinal banks so that the luminous polymer 90 affects the luminous polymer of adjacent pixels. If the scan speed of the nozzle 80 increases, the luminous layer 90 is formed within the trench between two longitudinal banks 50, but may be very thin in thickness. Thus, the completed organic electroluminescent device can have poor operating characteristics.

Furthermore, the thickness and leveling of the luminous layer 90 is affected by the shape of longitudinal banks 50. FIG. 4 is a cross-sectional view taken along a line IV-IV of FIG. 3. As shown in FIG. 4, the longitudinal banks 50 have a rectangular cross-section. Thus, the luminous polymer 90 rises high against the longitudinal bank 50 in a contacting portion S between the luminous polymer 90 and the longitudinal bank 50 due to the surface tension of the liquid phase luminous polymer 90. As a result, the luminous polymer 90 has a thick thickness in the area contacting the longitudinal bank 50, and a poor leveling condition exists. Consequently, the thickness non-uniformity and poor leveling of the luminous layer 90 makes the organic electroluminescent device have a poor light-emitting degree and efficiency. Further, the life span of the luminous layer 90 is shortened.

SUMMARY OF THE INVENTION

Accordingly, the present invention is directed to a method of fabricating an organic electroluminescent display device, which substantially obviates one or more of the problems due to limitations and disadvantages of the background art.

An object of the present invention is to provide a method of fabricating an organic electroluminescent display device, which allow a luminous polymer to have a uniform leveling and thickness during a nozzle coating process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of forming an organic electroluminescent device includes: forming a first electrode on a transparent substrate where a plurality of first, second and third pixels are defined; forming a plurality of longitudinal and transverse banks on the first electrode using a mask, wherein the longitudinal banks are disposed in a longitudinal direction along the major axis of the pixels along the borders of the neighboring pixels and have sloped sidewalls, and wherein the transverse banks are disposed in a transverse direction along the minor axis of the pixels along the borders of the neighboring pixels and have different heights and widths; forming organic luminous polymeric layers over the first electrode in the plurality of first, second and third pixels and in between the longitudinal banks, the organic luminous polymeric layers emitting red, green and blue light, respectively; and forming a second electrode over the organic luminous polymeric layers, the second electrode separately disposed in each of the first, second and third pixels.

In another aspect, a method of forming an organic electroluminescent device includes: defining a plurality of first, second and third pixels in a transparent substrate; forming a plurality of thin film transistors over the transparent substrate, each thin film transistor corresponding to each of the plurality of first, second and third pixels and including a gate electrode, an active layer, a source electrode and a drain electrode; forming a passivation layer over an entire of the substrate to cover the plurality of thin film transistors, the passivation layer having a plurality of drain contact holes each exposing the drain electrode; forming a first electrode on the passivation layer in each of the first, second and third pixels, the first electrode contacting the drain electrode through the drain contact hole; forming a plurality of longitudinal and transverse banks on the first electrode using a mask, wherein the longitudinal banks are disposed in a longitudinal direction along the major axis of the pixels along the borders of the neighboring pixels and have sloped sidewalls, and wherein the transverse banks are disposed in a transverse direction along the minor axis of the pixels along the borders of the neighboring pixels and have different heights and widths; forming organic luminous polymeric layers over the first electrode in the plurality of first, second and third pixels and in between the longitudinal banks, the organic luminous polymeric layers emitting red, green and blue light, respectively; and forming a second electrode over the organic luminous polymeric layers, the second electrode separately disposed in each of the first, second and third pixels.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to the illustrated embodiment of the present invention, which is illustrated in the accompanying drawings. Wherever possible, similar reference numbers will be used throughout the drawings to refer to the same or like parts.

Figure 5:
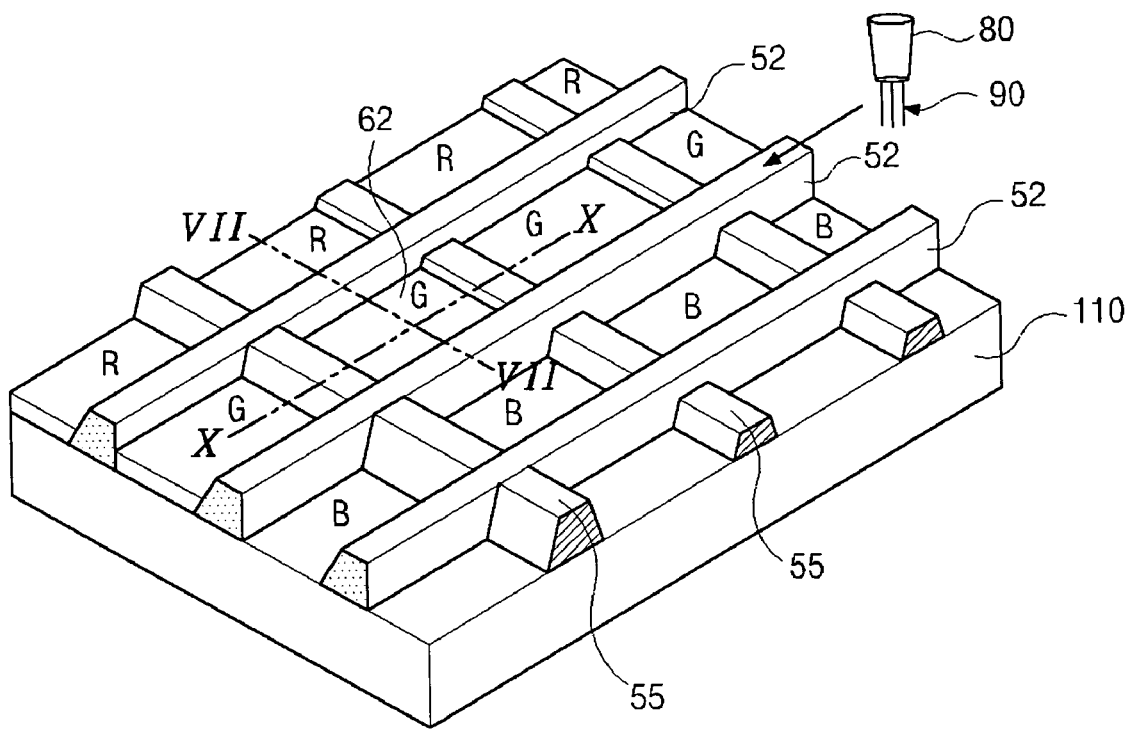
FIG. 5 is a schematic perspective view illustrating a substrate having longitudinal and transverse banks according to the present invention.

FIG. 5 is a schematic perspective view illustrating a substrate having longitudinal and transverse banks according to the present invention. As shown, a plurality of longitudinal banks 52 are formed over a substrate 110 in a longitudinal direction, and a plurality of transverse banks 55 are formed over the substrate 110 in a transverse direction. A plurality of pixels 62 are formed over the substrate 110 in between the longitudinal banks 52 and between the transverse banks 55. Namely, the longitudinal banks 52 divide the pixels 62 in a longitudinal direction (i.e., in a column direction) and the transverse banks 55 divide the pixels 62 in a transverse direction (i.e., in a row direction). The pixels 62 arranged in a column are coated by the same color organic luminous polymer 90. However, the pixels 62 arranged in the rows have the red (R), green (G) and blue (B) organic luminous polymer 90 in an alternate order. Thus, the longitudinal banks 52 divide the R, G and B organic luminous polymer 90 and prevent the transverse interruption of the neighboring pixel's organic luminous polymer.

Figure 1:
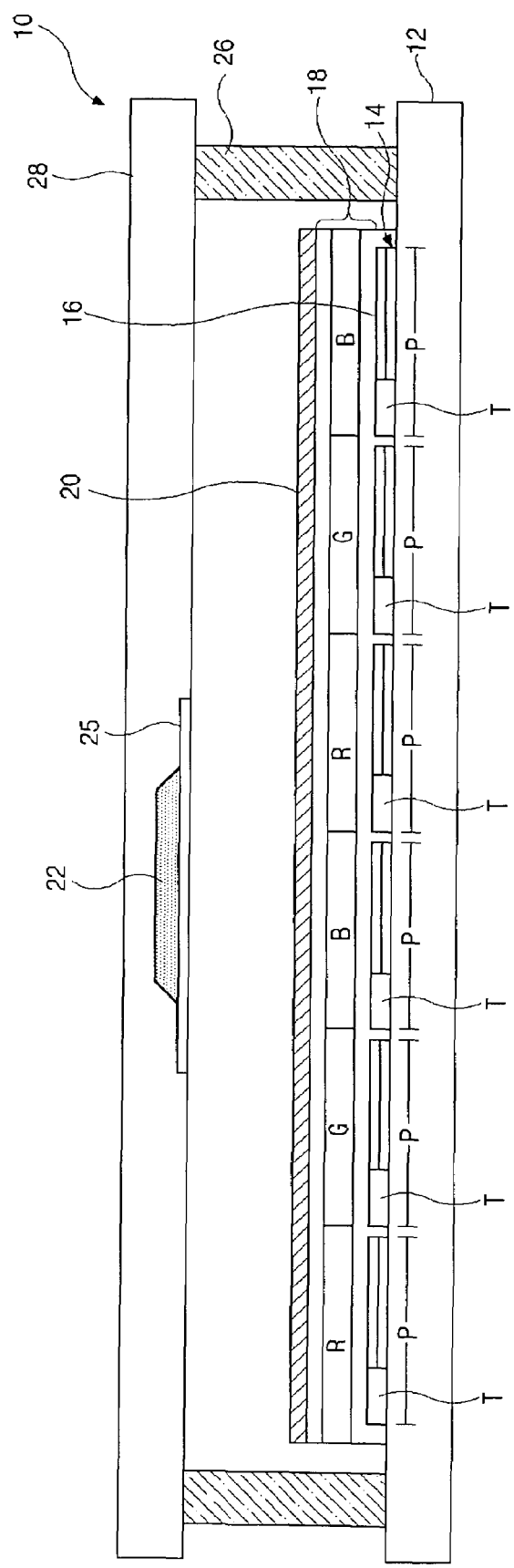
FIG. 1 is a schematic cross-sectional view illustrating an active matrix type organic electroluminescent display device according to the background art.
Figure 2:
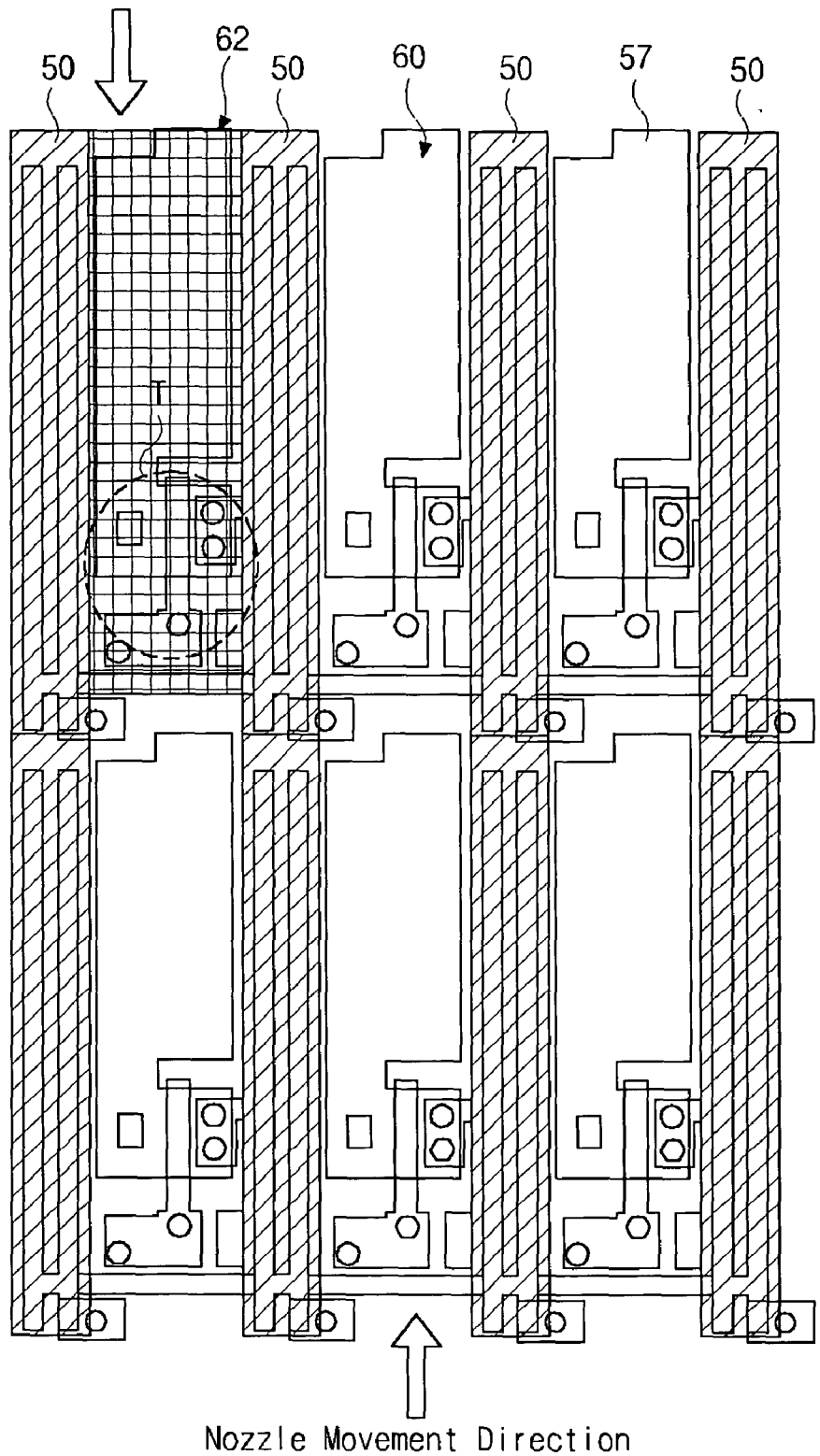
FIG. 2 is a schematic plan view illustrating an organic electroluminescent device having longitudinal banks according to background art.
Figure 3:
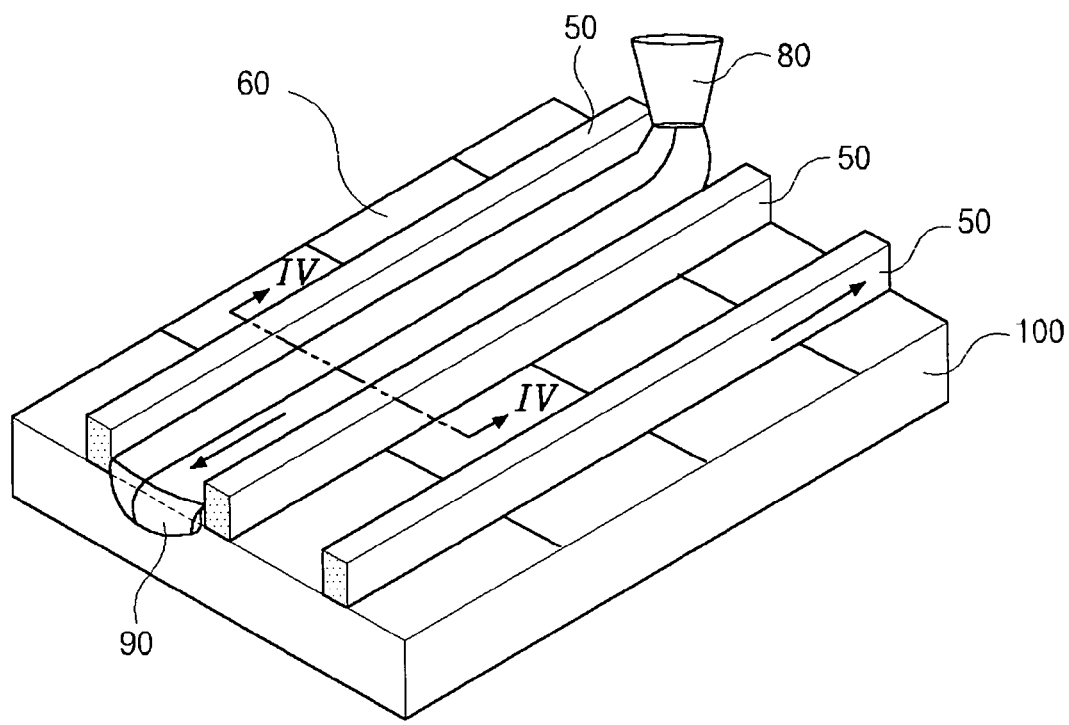
FIG. 3 is a schematic perspective view illustrating a nozzle injection for forming a luminous polymer over a substrate between longitudinal banks according to the background art.
Figure 4:
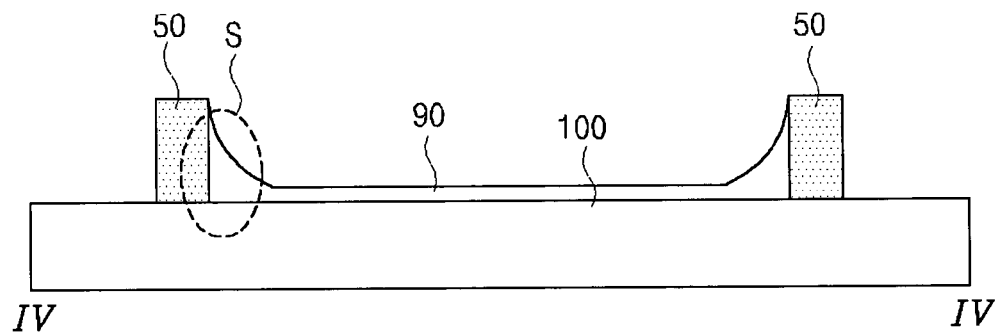
FIG. 4 is a cross-sectional view taken along a line IV-IV of FIG. 3.

As described with reference to FIG. 4, the organic luminous polymer 90 rises high leaning on the longitudinal direction and has a poor leveling condition in the contacting part S due to the surface tension. In order to prevent this phenomenon in the present invention, the longitudinal banks 52 of the present invention have various cross sections as shown in FIGS. 6A to 6C.

Figure 6A:
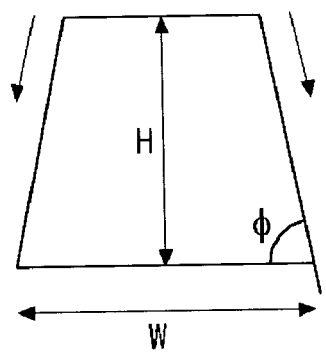
FIGS. 6A to 6C are cross-sectional views of embodiments of the longitudinal and transverse banks according to the present invention.
Figure 6B:
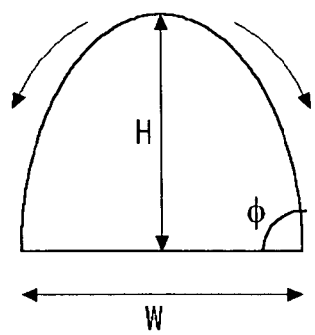
Figure 6C:
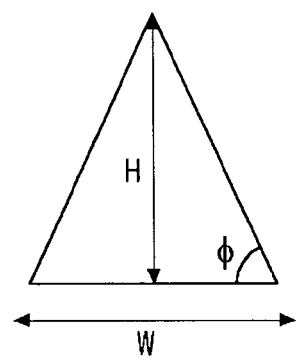

FIGS. 6A to 6C are cross-sectional views of the longitudinal and transverse banks according to the present invention. The longitudinal bank 52 can have a trapezoid shape (FIG. 6A), a triangular shape (FIG. 6B) or a semi-parabola shape (FIG. 6C), for example. Other shapes are possible so that the longitudinal banks have sloped sidewalls. The shapes of the sidewalls is determined based on various factors, including the bank material, the etchant and etch rate, and the particular photoresist and developer used. The slope-sides of the longitudinal bank 52 can have an angle Φ from the substrate. The value of angle Φ can vary ranging from 0 to 90 degrees. Further, a width W and height H of the longitudinal bank 52 can also vary depending on what shape of bank is adopted and what type of organic luminous polymer is used.

Figure 7:
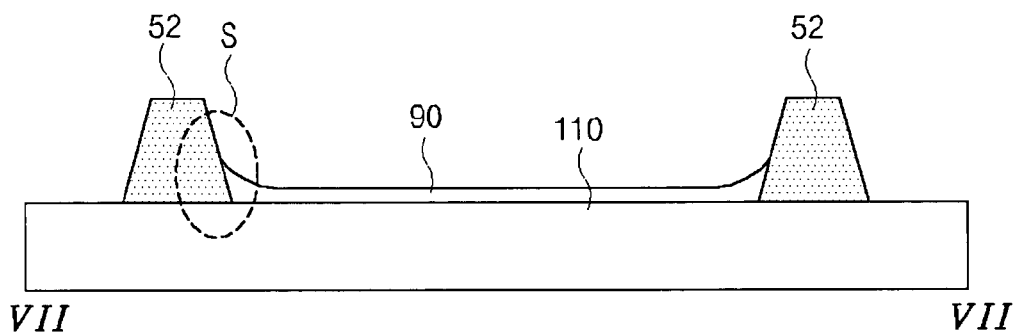
FIG. 7 is a cross-sectional view taken along a line VII-VII of FIG. 5.

FIG. 7 is a cross-sectional view taken along a line VII-VII of FIG. 5. When the longitudinal bank 52 has the sloped sides as show in FIG. 7, the organic luminous polymer 90 injected from the nozzle (reference 80 of FIG. 5) slides down along the sloped sides. Therefore, the organic luminous polymer 90 is not thick in thickness in the contacting part S between the longitudinal bank 52 and the organic luminous polymer 90, thereby achieving the uniform leveling all over the substrate 10.

When the transverse banks 55 of FIG. 5 have the cross-sectional shapes shown in FIGS. 6A to 6C, the organic luminous polymer 90 formed over the transverse banks 55 can show the same characteristics as that formed between the longitudinal banks 52. Like the longitudinal bank 52, the transversal bank 55 can have a trapezoid shape (FIG. 6A), a triangular shape (FIG. 6B) or a semi-parabola shape (FIG. 6C), for example. Other shapes are possible the so that transverse bank has sloped sidewalls. The slope-sides of the transverse bank 55 can have an angle Φ from the basic substrate. The value of angle Φ can vary ranging from 0 to 90 degrees. Further, width W and height H of the transversal bank can also vary depending on what shape of bank is adopted and what type of organic luminous polymer is used.

The longitudinal and transverse banks 52 and 55 are formed together at the same process step. When forming the longitudinal and transverse banks 52 and 55, the longitudinal bank 52 are controlled to have the same height sufficient to prevent the overflow of the injected organic luminous polymer 90. However, the transverse banks 55 can be formed to have various heights. These height variations can be achieved by a diffraction exposure during a mask process to a photoresist. The diffraction exposure will be explained with reference to FIGS. 8A-8B and 9A-9B.

Figure 8A:
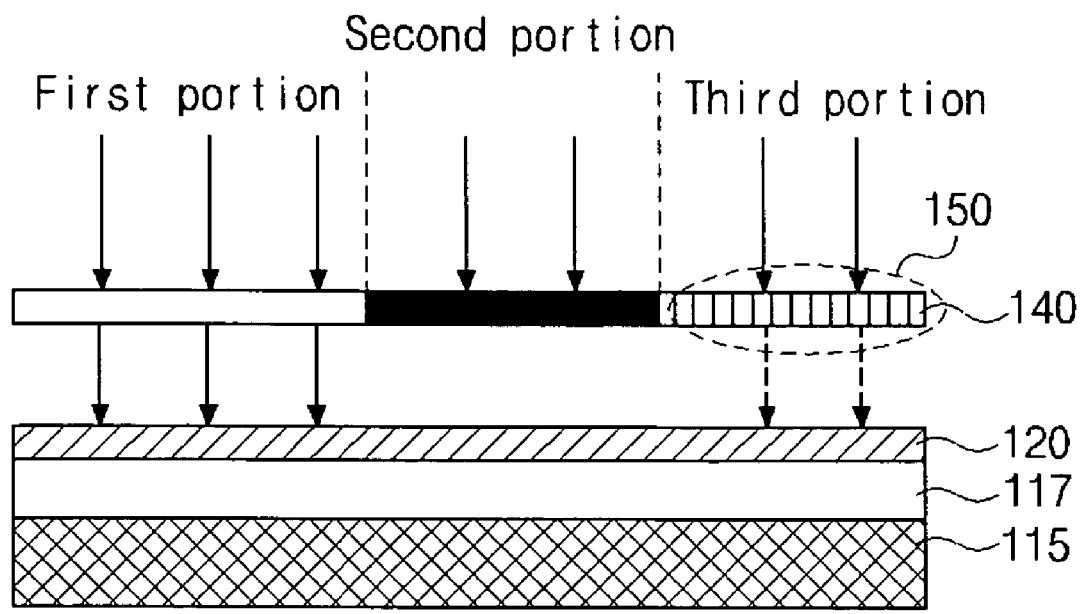
FIGS. 8A and 8B illustrate the process steps of forming the banks using a negative photoresist according to the present invention.
Figure 8B:
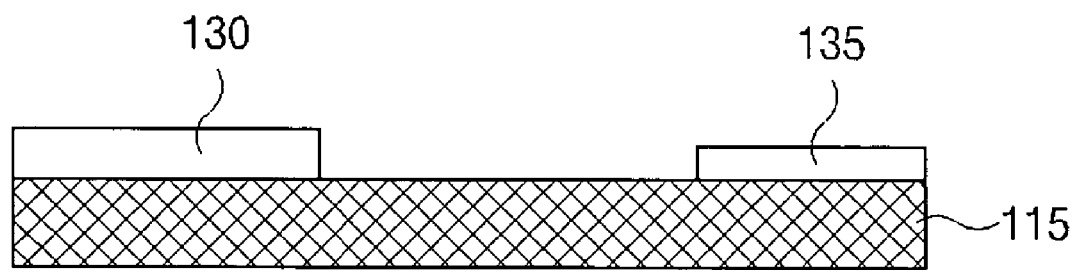

FIGS. 8A and 8B illustrate the process steps of forming the banks using a negative photoresist according to the present invention.

As shown in FIG. 8A, an organic layer 117 is formed over a substrate 115. Thereafter, a negative photoresist 120 is formed on the organic layer 117. After a mask 140 is disposed above the negative photoresist 120, the ultraviolet (UV) ray irradiates the photoresist 120 through the mask 140.

In this exposure process, the mask 140 includes a first portion where the UV ray completely passes, a second portion where the UV ray is completely blocked, and a third portion where some of the UV ray passes and same is blocked. The first portion is completely opened to apply the UV ray to the corresponding portion of the negative photoresist 120. The second portion of the mask completely blocks the UV ray so that a portion of the negative photoresist 120 corresponding to this second portion is removed in the developing process. The third portion includes a lot of slits 150 to diffract the UV ray so that a portion of the UV ray passes the mask 140 and slightly irradiates the corresponding portion of the negative photoresist 120. After the UV irradiation throughout the mask 140, the negative photoresist 120 is developed to have desired patterns. The completely exposed portion of the negative photoresist 120 corresponding to the first portion remains as it was. The completely unexposed portion corresponding to the second portion is removed so that the organic layer 117 is exposed. And the slightly exposed portion of the negative photoresist 120 corresponding to the third portion is slightly removed and does not have its initial thickness due to the fact that this negative photoresist portion is exposed by the diffracted UV ray.

After the developing process, an etching process is conducted to the remaining photoresist and organic layer 117. While etching the portion of the negative photoresist 120 corresponding to the first portion of the mask, the portion of the organic layer 117 corresponding to the second portion of the mask is also etched out. Further, the residual portion of the negative photoresist 120 corresponding to the third portion is completely removed and the top portion of the organic layer 117 is partially removed. Therefore, the banks 130 and 135 are finally formed with different thicknesses as shown in FIG. 8B. The bank 130 corresponding to the first portion of the mask 140 has a large thickness so that it can be the longitudinal banks 52 of FIG. 5 or the transversal banks 55 having a large height. And the bank 135 corresponding to the third portion of the mask 140 has a small thickness so that it can be the transversal bank 55 having a small height.

Figure 9A:
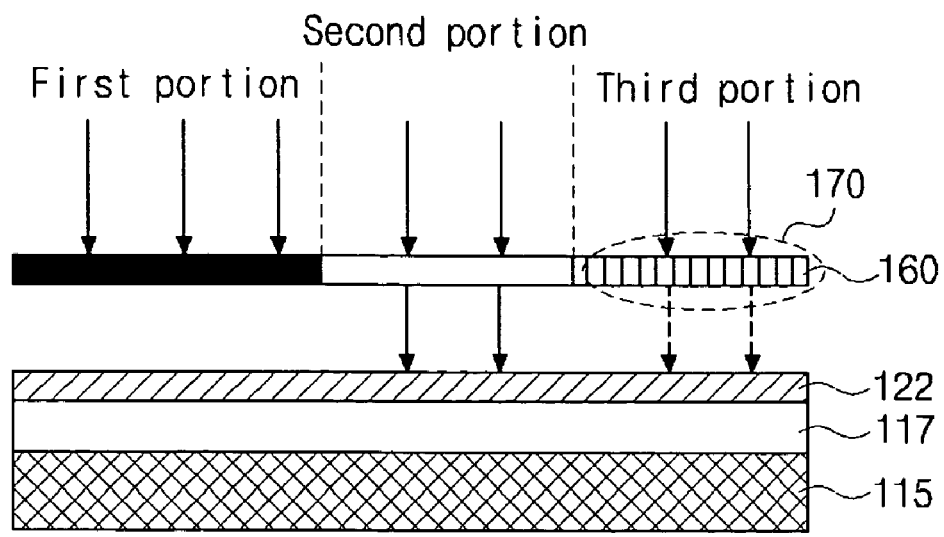
FIGS. 9A and 9B illustrate the process steps of forming the banks using a positive photoresist according to the present invention.
Figure 9B:
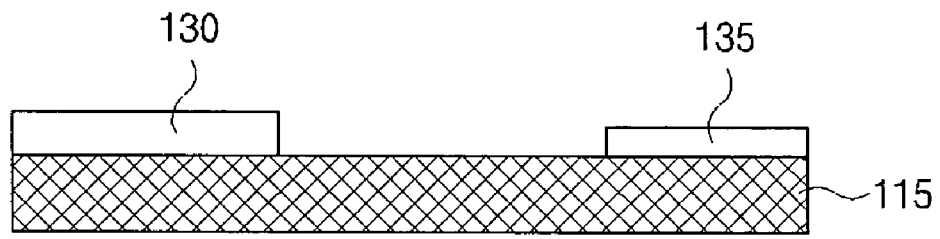

FIGS. 9A and 9B illustrate the process steps of forming the banks using a positive photoresist according to the present invention.

As shown in FIG. 9A, an organic layer 117 is formed over a substrate 115. Thereafter, a positive photoresist 122 is formed on the organic layer 117. After a mask 160 is disposed above the positive photoresist 122, the ultraviolet (UV) ray irradiates the positive photoresist 122 through the mask 160.

In this exposure process, the mask 160 includes a first portion where the UV ray is completely blocked, a second portion where the UV ray completely passes, and a third portion where some of the UV ray passes and some is blocked.

The first portion of the mask 160 completely blocks the UV ray so that a portion of the positive photoresist 122 corresponding to this first portion is removed in a developing process. The second portion is completely opened to apply the UV ray to the corresponding portion of the positive photoresist 122. The third portion includes a lot of slits 170 to diffract the UV ray so that a portion of the UV ray passes the mask 160 and slightly irradiates the corresponding portion of the positive photoresist 122. After the UV irradiation throughout the mask 160, the positive photoresist 122 is developed to have desired patterns. The completely unexposed portion of the positive photoresist 122, which corresponds to the first portion of the mask 160, remains as it was. The completely exposed portion of the positive photoresist 122, which corresponds to the second portion of the mask 160, is removed so that the organic layer 117 is exposed. And the slightly exposed portion of the positive photoresist 122 corresponding to the third portion is slightly removed and does not have its initial thickness due to the fact that this positive photoresist portion is exposed by the diffracted UV ray.

After the developing process, an etching process is conducted to the remaining photoresist and organic layer 117. While etching the portion of the positive photoresist 122 corresponding to the first portion of the mask, the portion of the organic layer 117 corresponding to the second portion of the mask 160 is also etched out. Further, the residual portion of the positive photoresist 122 corresponding to the third portion is completely removed and the top portion of the organic layer 117 corresponding to the third portion is partially removed. Therefore, like the negative photoresist process shown in FIGS. 8A and 8B, the banks 130 and 135 are finally formed with different thicknesses as shown in FIG. 9B. The bank 130 corresponding to the first portion of the mask 160 has a large thickness so that it can be the longitudinal banks 52 of FIG. 5 or the transversal banks 55 having a large height. And the bank 135 corresponding to the third portion of the mask 160 has a small thickness so that it can be the transversal bank 55 having a small height.

As described with reference to FIGS. 8A-8B and 9A-9B, the longitudinal banks 52 and the transverse banks 55 can be formed together at the same mask process although they have different thicknesses. Because the mask 140 or 160 has the slit portion 150 and 170 and the diffraction of UV ray is utilized, the transverse banks 55 can be formed to have the different heights and the longitudinal banks 52 can be formed to have the uniform thickness.

Figure 10:
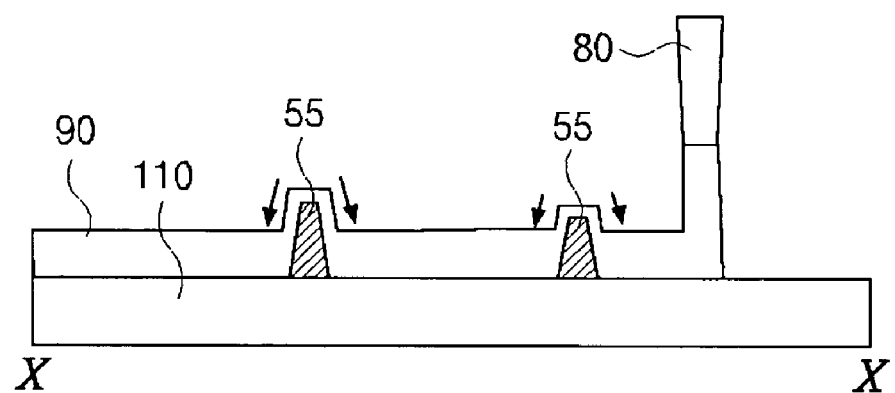
FIG. 10 is a cross-sectional view taken along a line X-X of FIG. 5 and illustrates forming an organic luminous polymer over the transverse banks according to the present invention.

FIG. 10 is a cross-sectional view taken along a line X-X of FIG. 5 and illustrates forming an organic luminous polymer over the transverse banks according to the present invention.

The transverse banks 55 having different heights are disposed over the substrate 110 and then the organic luminous polymer 90 is coated over the substrate 110 and over the transverse banks 55 by way of being injected from the nozzle 80. As described with reference to FIGS. 6A-6C, the transverse bank 55 has the sloped sidewalls so that the coated organic luminous polymer 90 may slide down along those sidewalls. Therefore, the uniform leveling of the organic luminous polymer 90 can be achieved. Furthermore, the transverse banks 55 prevent the down-streaming of the injected luminous polymer 90 at the edge of the substrate 110.

The thickness of the coated organic luminous polymer 90 is controlled depending on the height and width of the transverse banks 55. Further, the thickness of the coated luminous polymer 90 can be controlled by the nozzle injection. The scan speed of nozzle 80 and the injecting quantity of the organic luminous polymer 90 determine the thickness of the luminous polymer 90. To control and determine the thickness of the organic luminous polymer 90, experimental data are collected through repeated experiments. Before forming the transverse banks 55, the nozzle scanning is conducted over the substrate 110 and then the nozzle scan speed and injection quantity are datumized and the thicknesses of coated organic luminous polymer are also datumized. On the basis of the datumized data, the transverse banks 55 is designed to have the optimized height and width. By controlling the height and width of the transverse banks, the organic luminous polymer 90 is formed to have a desired thickness. If the nozzle 80 injects a small quantity of organic luminous polymer 90 over some of the transverse banks, those banks is designed to have large heights and widths. If the nozzle 80 injects a large quantity of organic luminous polymer 90 over some of the transversal banks, those banks is designed to have small heights and widths.

Furthermore as described before, the transverse banks 55 prevent the down-streaming of the coated organic luminous polymer 90 out of the substrate 110. At the end of the trench formed between two longitudinal banks 52, the organic luminous polymer 90 streams down in the conventional art. However, in the present invention, since the transverse banks 55 block that down-streaming, the coated organic luminous polymer 90 is not lost anymore, thereby achieving excellent and uniform thickness leveling all over the substrate 110.

In the present invention, the height of the transverse bank is designed to be less than that of the longitudinal bank. The lowest height of the transverse bank is equal to or greater than the thickness of coated organic luminous polymer.

Hereinafter, the passive and active matrix type organic electroluminescent devices, which include the above-mentioned longitudinal and transverse banks, will be explained with references to FIGS. 11-12 and 13-14.

Figure 11:
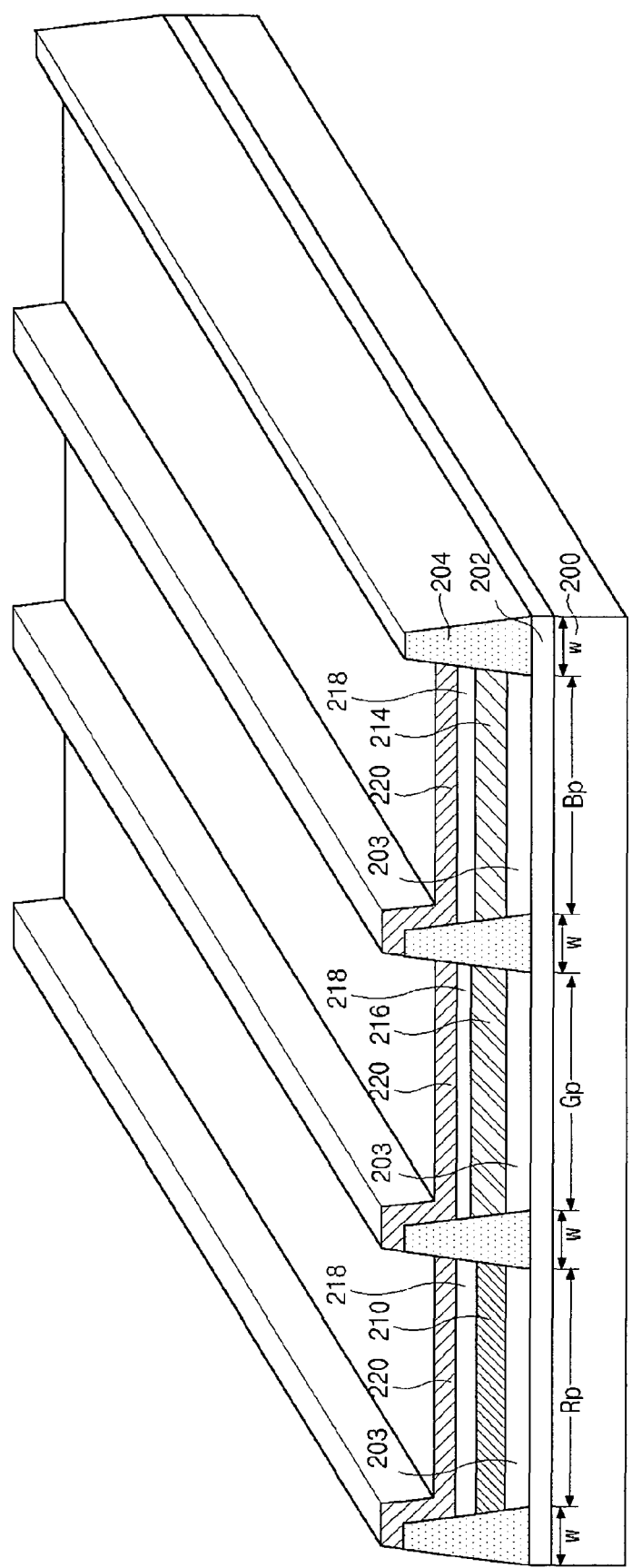
FIG. 11 is a perspective view of a passive matrix type organic electroluminescent device according to the present invention.

FIG. 11 is a perspective view of a passive matrix type organic electroluminescent device according to the present invention.

As shown in FIG. 11, a first electrode 202 is formed on a substrate 200 that includes defined first, second and third pixels Rp, Gp and Bp. On the first electrode 202, longitudinal banks 204 are formed to have the same height. Although not shown in FIG. 11, transverse banks (reference 206 of FIG. 12A) are also formed on the first electrode 202, but the transverse banks have different heights and widths. Although the longitudinal banks 204 have the same height, they can have different widths W.

In the pixels Rp, Gp and Bp, organic luminous polymeric layers 210, 214 and 216 are disposed respectively. The organic luminous polymeric layer 210 formed in the pixel Rp emits red light, the organic luminous polymeric layer 216 formed in the pixel Gp emits green light, and the organic luminous polymeric layer 214 formed in the pixel Bp emits blue light. Over each of the organic luminous polymeric layers 210, 216 and 214, a second electrode 220 is formed. The second electrode 220 is electrically separated from that of a neighboring pixel so that each of the pixels Rp, Gp and Bp includes one second electrode 220. The first electrode 202 injects holes to the organic luminous polymeric layers 210, 216 and 214 so that it is often referred to as an anode electrode. The second electrode 220 injects electrons to the organic luminous polymeric layers 210, 216 and 214 so that it is often referred to as a cathode electrode.

The longitudinal bank 204 of the present invention acts to separate the second electrode 220 independently into the pixels Rp, Gp and Bp, prevents the diffusion of the organic luminous polymeric layers 210, 216 and 214, and makes the organic luminous polymeric layers 210, 216 and 214 have the uniform leveling by way of sliding down on their sloped sides. Furthermore, the transverse banks (reference 206 of FIG. 12A) make the organic luminous polymer have the uniform thickness and leveling when the organic luminous polymer is nozzle-coated in the trench between two longitudinal banks 204.

Still referring to FIG. 11, a hole transporting layer 203 and an electron transporting layer 218 are formed, respectively, on top and bottom surfaces of the organic luminous polymeric layers 210, 216 and 214. Due to the hole and electron transporting layers 203 and 218, the carriers (hole and electrons) are not directly injected to the organic luminous polymeric layers 210, 216 and 214. Since the carriers pass through the transporting layer 203 and 218 from the electrodes 202 and 220 to the organic luminous polymeric layers 210, 216 and 214 (i.e., a two step injection), a quantum efficiency (photon-out per injected-charge) can increase and a driving voltage can be lowered.

When forming the second electrode 220 over the organic luminous polymeric layers 210, 216 and 214, a deposition direction is controlled so that the second electrode 220 is separately formed in each of the pixels Rp, Gp and Bp. One way for controlling the deposition direction is to incline the substrate 200 when depositing the second electrode 220. The substrate inclination prevents the second electrode 220 from overlapping the longitudinal banks 204 during the deposition process so that the second electrode 220 is separately formed in each of the pixels Rp, Gp and Bp. Another way for controlling the deposition direction is to control a target position for the second electrode 220. By way of moving the target for the second electrode deposition, the second electrode 220 is also formed separately in each of the pixels Rp, Gp and Bp. Namely, controlling the deposition direction makes the second electrode 220 form only right above the organic luminous polymeric layers 210, 216 and 214 and on the top and one sloped sidewall of the longitudinal banks 204.

Figure 12A:
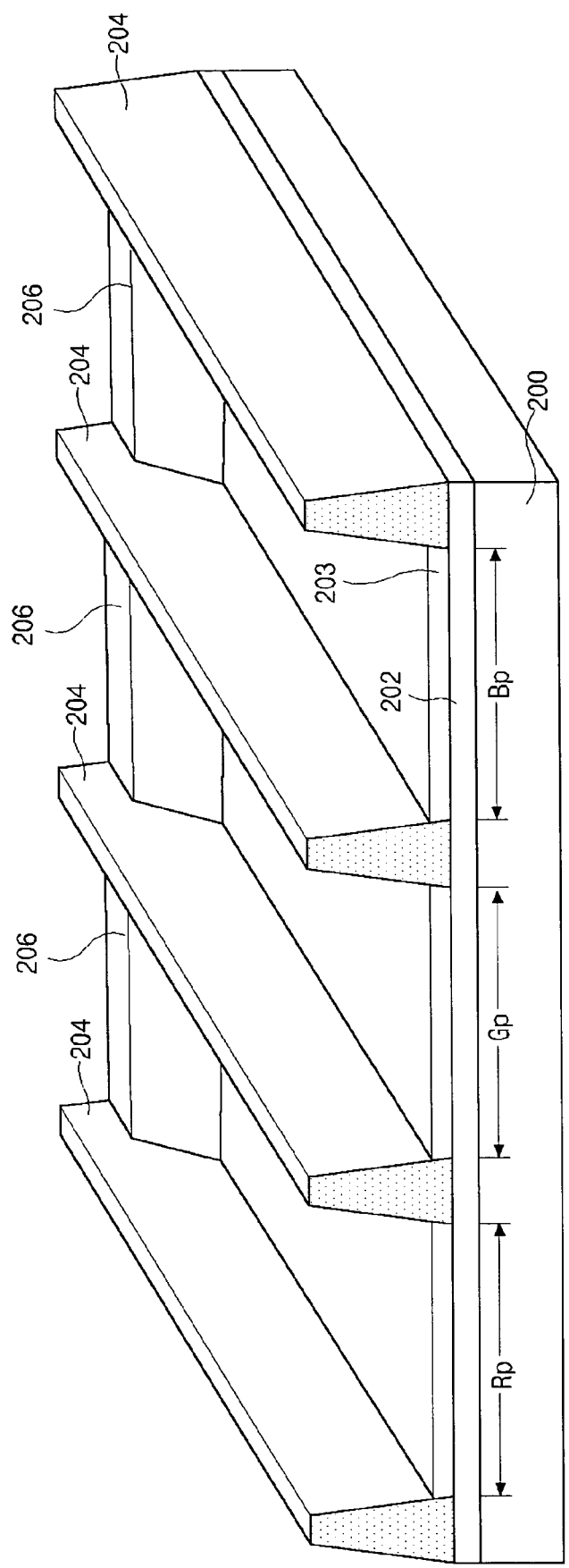
FIGS. 12A to 12C illustrate the process steps of forming the passive matrix type organic electroluminescent device of FIG. 11.
Figure 12B:
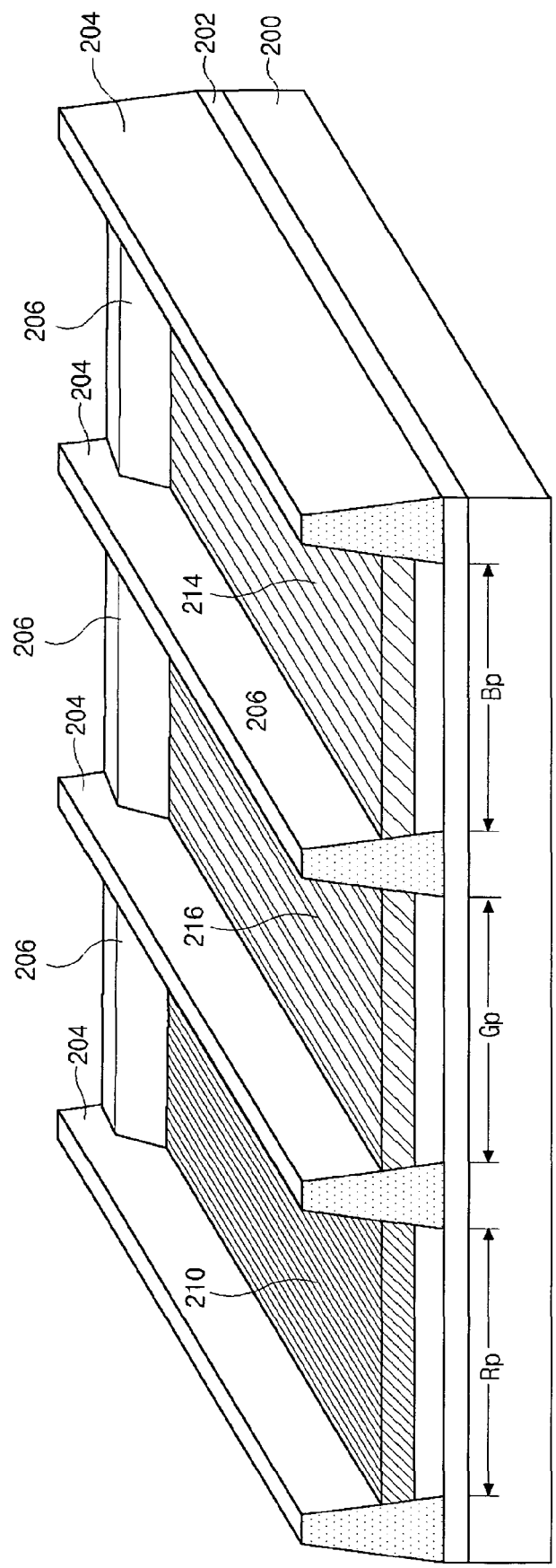
Figure 12C:
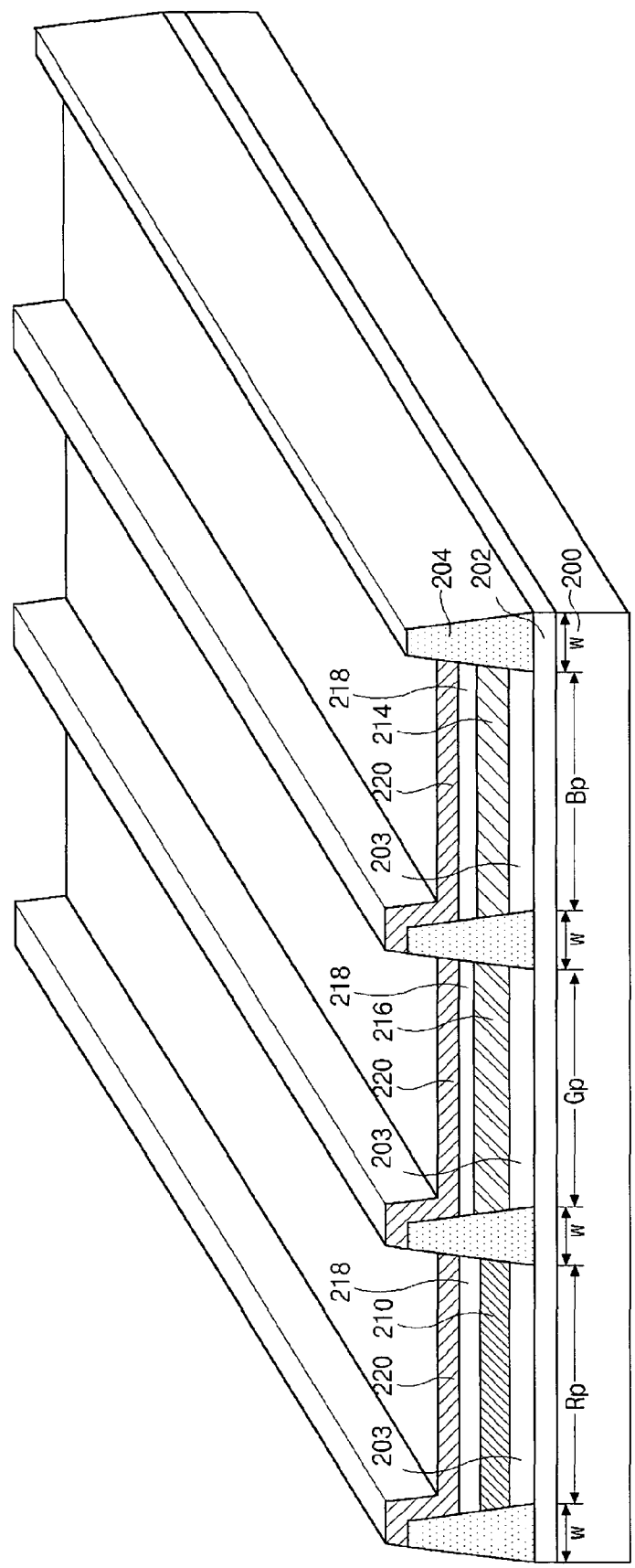

The passive matrix type organic electroluminescent device described in FIG. 11 can be formed by the above-mentioned nozzle coating over the substrate having the inventive longitudinal and transversal banks. FIGS. 12A to 12C illustrate the process steps of forming the passive matrix type organic electroluminescent device of FIG. 11.

Referring to FIG. 12A, the substrate 200 includes the first, second and third pixels Rp, Gp and Bp. The first electrode 202 is formed on the substrate 220 where the first, second and third pixels Rp, Gp and Bp are defined. As mentioned before, the first electrode 202 is an anode electrode that has a high work function. For example, the first electrode 202 may be formed of indium tin oxide (ITO). Next, the longitudinal banks 204 and the transverse banks 206 are formed together on the first electrode 202. The longitudinal banks 204 and the transverse banks 206 are formed of a high molecular substance, for example, polyimide. Further, one of the processes described with reference to FIGS. 8A-8B and 9A-9B is applied for forming the longitudinal and transverse banks 204 and 206. Since the diffraction exposure is utilized with the mask having a lot of slits, the longitudinal banks 204 have the same height with the sloped sides and the transverse banks 206 have the different heights and widths also with the sloped sides. Thereafter, the hole transporting layer 203 is formed on the first electrode 203.

Next in FIG. 12B, the organic luminous polymeric layers 210, 216 and 214 are formed separately in the first, second and third pixels Rp, Gp and Bp using the nozzle coating method. The organic luminous polymeric layers 210, 216 and 214 emit red, green and blue light, respectively. When forming each of the organic luminous polymeric layers 210, 216 and 214, the organic luminous polymer is coated over the transverse banks 206 as shown in FIG. 10. However, since the transverse banks 206 have the sloped sidewalls, the organic luminous polymer slides down and then is uniformly leveled in the first, second and third pixels Rp, Gp and Bp.

In FIG. 12C, a high molecular substance is coated on the organic luminous polymeric layers 210, 216 and 214 to form the electron transporting layer 218. The electron transporting layer 218 may be formed only in the first, second and third pixels Rp, Gp and Bp, or both in the first, second and third pixels Rp, Gp and Bp and over the transverse banks 206. Thereafter, a conductive material having a low work function, such as aluminum (Al), magnesium (Mg) or calcium (Ca), is deposited all over the substrate 200, thereby forming the second electrode 220 (i.e., the cathode electrode). As mentioned before, when forming the second electrode 220, the deposition direction is controlled to separately form the second electrode 220 into each of the first, second and third pixels Rp, Gp and Bp. As shown in FIG. 12C, the longitudinal banks 206 act as separators that let the layer elements be disposed into each of the first, second and third pixels Rp, Gp and Bp.

Figure 13:
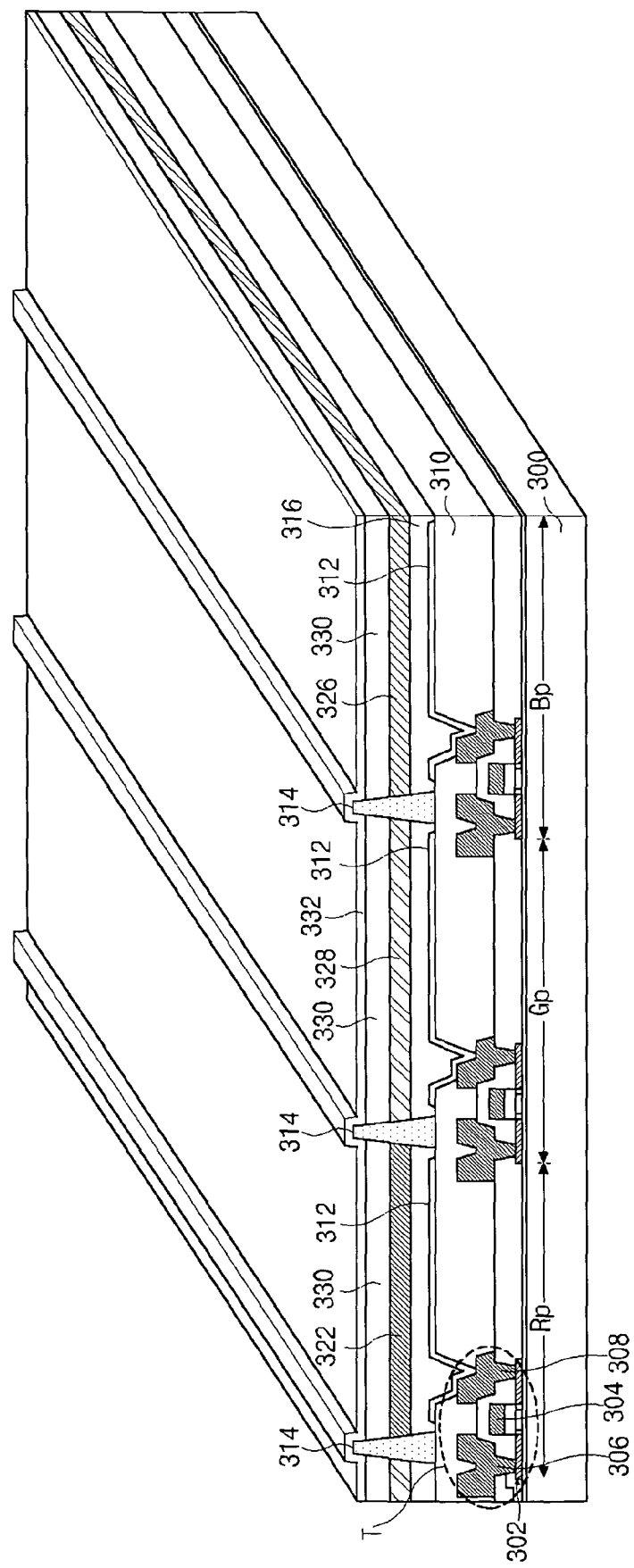
FIG. 13 is a perspective view of an active matrix type organic electroluminescent device according to the present invention.

FIG. 13 is a perspective view of an active matrix type organic electroluminescent device according to the present invention.

As shown in FIG. 13, thin film transistors (TFTS) T are formed over a substrate 300 that has first, second and third pixels Rp, Gp and Bp. Each TFT T is disposed in each of the first, second and third pixels Rp, Gp and Bp, and has a gate electrode 304, an active layer 302, a source electrode 306 and a drain electrode 308. A passivation layer 310 is disposed over an entire of the substrate 300 while covering the TFTs T. A first electrode 312 is disposed on the passivation layer 310 in each of the first, second and third pixels Rp, Gp and Bp. The first electrode 312 contacts the drain electrode 308 of the TFT T through a drain contact hole that penetrates the passivation layer 310. Further on the first electrode of each pixel Rp, Gp or Bp, sequentially disposed are a hole transporting layer 316, an organic luminous polymeric layer 322, 326 or 328, and an electron transporting layer 330. A second electrode 332 is disposed on the electron transporting layer 330 over the entire substrate 300.

Still referring to FIG. 13, a plurality of longitudinal banks 314 are disposed on the passivation layer 310. Although not shown in FIG. 13 but shown in FIG. 14B, transverse banks 315 are also disposed on the passivation layer 310. The longitudinal and transverse banks 314 and 315 are disposed along the borders of the first, second and third pixels Rp, Gp and Bp so that they divide and separate the layer elements (the first electrode 312, the hole transporting layer 316, the organic luminous polymeric layers 322, 326 and 328, the electron transporting layer 330) into the first, second and third pixels Rp, Gp and Bp. Namely, the longitudinal and transverse banks 314 and 315 further prevent the organic material from diffusing into the neighboring pixel. Further as aforementioned, the longitudinal and transverse banks 314 and 315 make the coated organic material have a uniform thickness and level.

FIGS. 14A to 14D illustrate the process steps of forming the active matrix type organic electroluminescent device of FIG. 13.

Figure 14A:
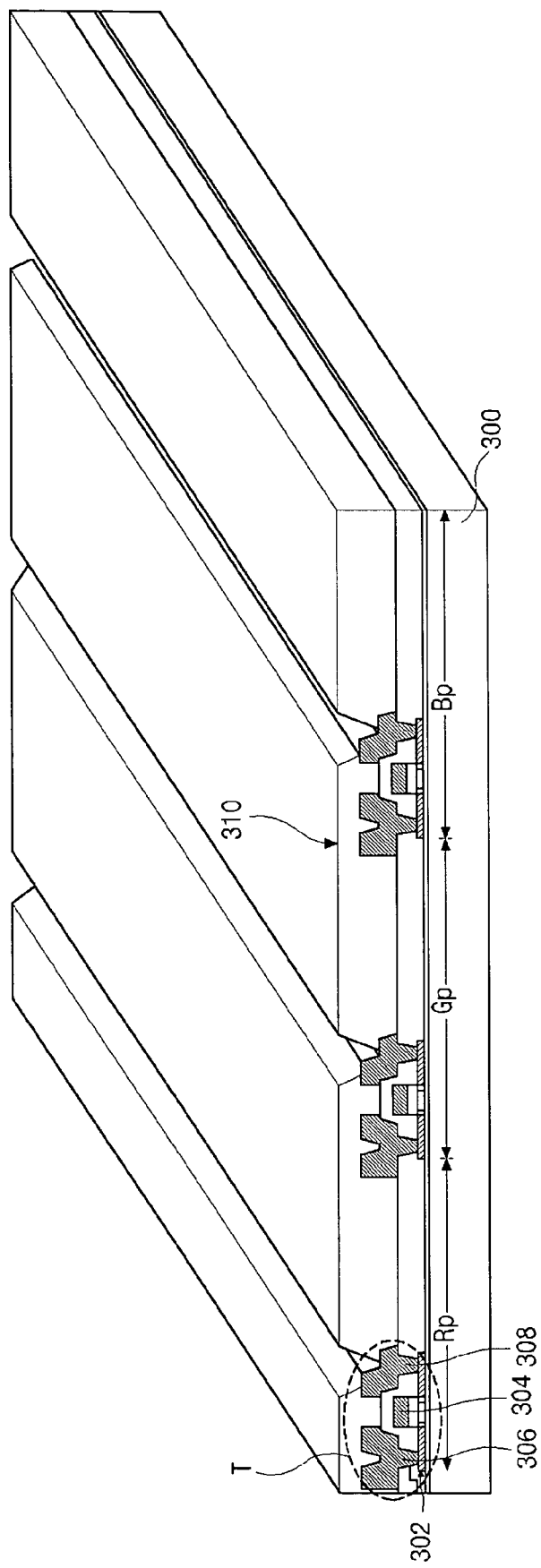
FIGS. 14A to 14D illustrate the process steps of forming the active matrix type organic electroluminescent device of FIG. 13.

Referring to FIG. 14A, the first, second and third pixels Rp, Gp and Bp are defined in the transparent plastic or glass substrate 300. The pixel Rp is for red color, the pixel Gp is for green color, and the pixel Bp is for blue color. In each pixel Rp, Gp or Bp, the thin film transistor (TFT) T is formed over the substrate 300. As mentioned above, the TFT T includes the active layer 302, the gate electrode 304, the source electrode 306 and the drain electrode 308. Thereafter, an organic material, such as benzocyclobutene (BCB) or acrylic resin, is formed over the substrate 300 to cover the TFTs T, thereby forming the passivation layer 310. Then, the passivation layer 310 is patterned to form the drain contact holes that expose the drain electrodes 308 of the TFTs T.

Figure 14B:
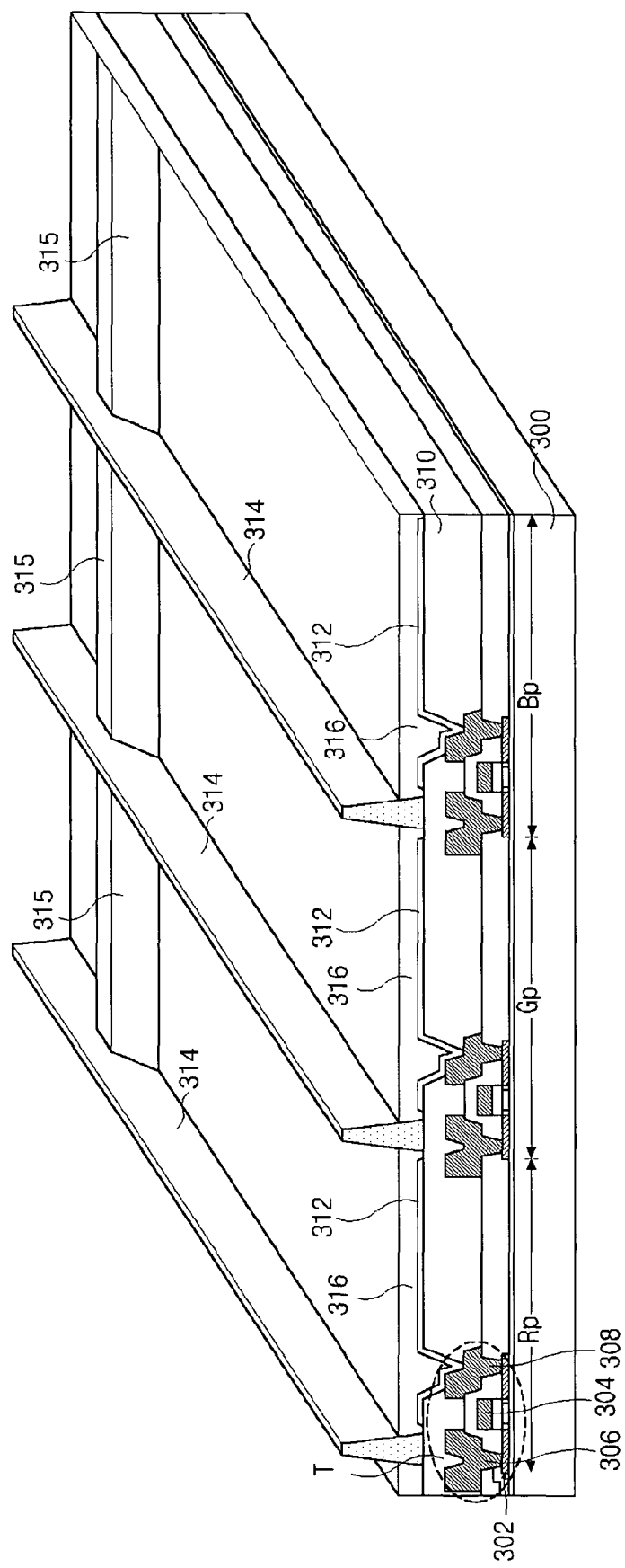

In FIG. 14B, the first electrode 312 is formed independently in each of the first, second and third pixels Rp, Gp and Bp. The first electrode 312 is a transparent conductive electrode having a high work function, for example, indium tin oxide (ITO). After that, the longitudinal banks 314 are formed in a longitudinal direction along the borders of the first, second and third pixels Rp, Gp and Bp. As described with reference to FIGS. 5-9, the longitudinal banks 314 have the same height and the sloped sidewalls. At the time of forming the longitudinal banks 314, the transverse banks 315 are also formed. Since the diffraction of light is used to form the transverse banks 315 as illustrated with reference to FIGS. 8A-8B and 9A-9B, the transverse banks 315 can have different heights and widths. The transverse banks 315 are disposed in a transverse direction on the borders of up-and-down pixels, and also have the sloped sidewalls. Since the mask for the longitudinal and transverse banks 314 and 315 has a lot of slits and the light diffraction is utilized, the different heights and width of the banks can be obtained according to the present invention. After the longitudinal and transverse banks 314 and 315 are formed, an organic material is coated all over the substrate to form the hole transporting layer 316. Since the longitudinal and transverse banks 314 and 315 have the sloped sidewalls and the coated organic material may slide down along the sloped sidewalls, the hole transporting layer 316 of the organic material is formed in each of the first, second and third pixels Rp, Gp and Bp.

Figure 14C:
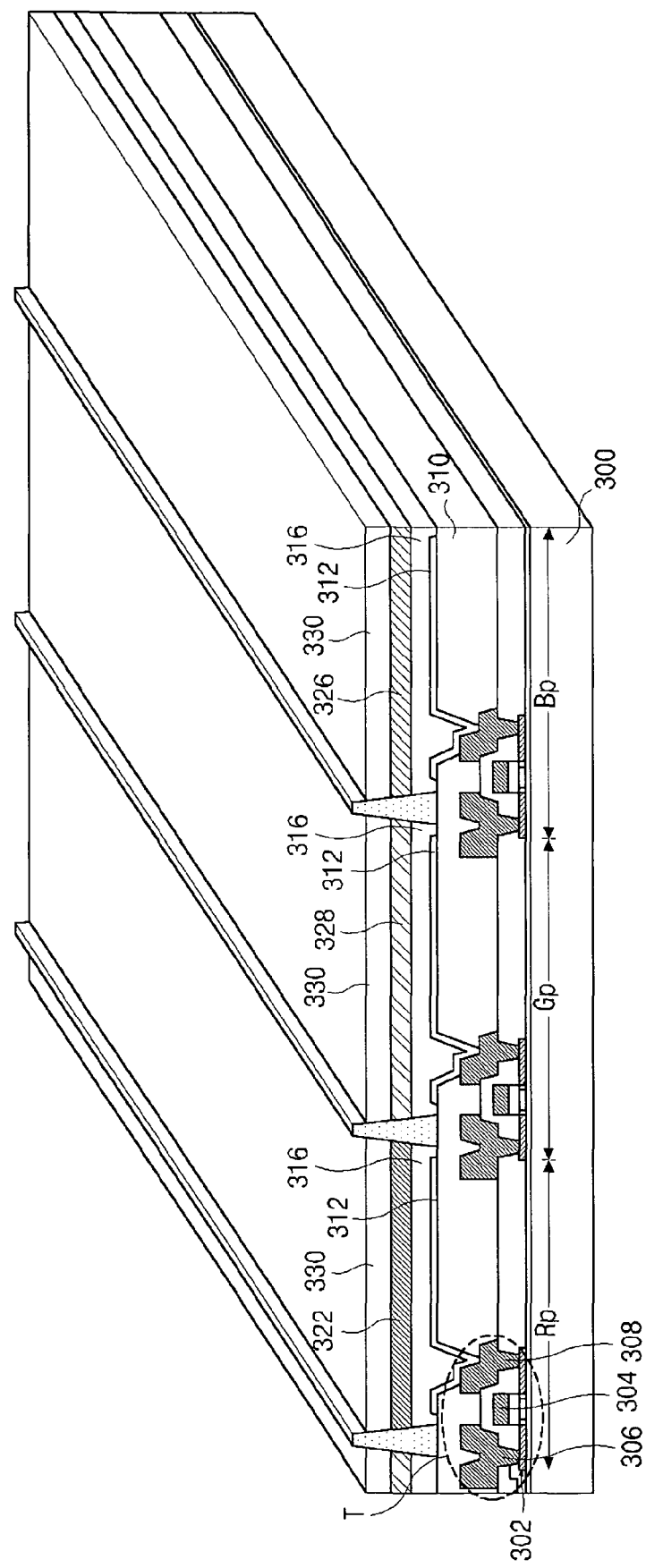

Now in FIG. 14C, the organic luminous polymeric layer 322, 326 and 328 are formed on the hole transporting layer 316 using the nozzle coating method described with reference to FIG. 10. The organic luminous polymeric layers 322, 326 and 328 emit red, green and blue light, respectively. Because of the longitudinal and transverse banks 314 and 315 having the sloped sidewalls and the desired heights and widths, the organic luminous polymeric layers 322, 326 and 328 become leveled and have uniform thickness. After forming the organic luminous polymeric layers 322, 326 and 328, an organic material is coated on the organic luminous polymeric layers 322, 326 and 328 to form the electron transporting layer 330.

Figure 14D:
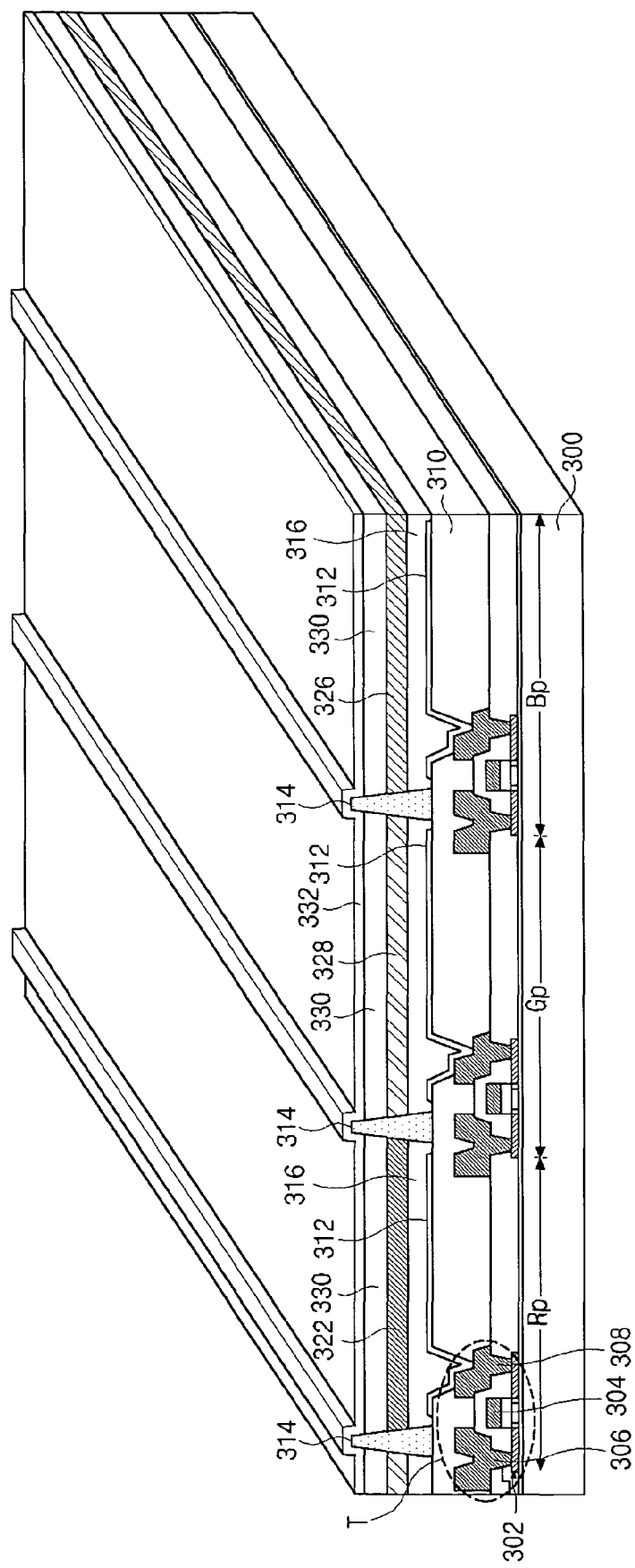

Next, in FIG. 14D, a conductive material having a low work function, such as aluminum (Al), magnesium (Mg) or calcium (Ca), is deposited all over the substrate 300, thereby forming the second electrode 332 (i.e., the cathode electrode).

According to the present invention described hereinbefore, the diffraction exposure is adopted using the negative or positive photoresist when forming the longitudinal and transverse banks that have the sloped sides and different heights and widths. Additionally, the organic luminous polymeric layers are nozzle-coated over the substrate having those longitudinal and transverse banks. As a result, the organic luminous polymeric layers formed in the pixels exhibit excellent leveling and thickness uniformity. The organic electroluminescent device including such organic luminous polymeric layers can have excellent display characteristics. Further, since the transverse banks are formed together with the longitudinal banks using the same mask and diffraction exposure, an additional process for forming the longitudinal or transverse banks is not required, thereby decreasing the cost of production.

It should be understood that while the foregoing discussion has been made with respect to the deposition of the organic electroluminescent material by nozzle coating, it is envisioned that other coating methods may be utilized for depositing the organic electroluminescent material into the pixel area of the substrate, such as "ink-jet" coating. As an exemplary method of ink-jet coating, a head including a reservoir and a plurality of aligned ejection orifices is passed over the substrate, and droplets of organic electroluminescent material are ejected from the plurality of orifices and into the pixel areas of the substrate.

The head may have a plurality of chambers, each associated with a respective orifice, such that when pressure or vibration is applied to the chamber, such as by application of an electric current to a piezoelectric crystal associated with the chamber, a droplet of organic electroluminescent material is ejected from the orifice and into the pixel area. The quantity of organic electroluminescent material ejected into the pixel area can be controlled by varying the droplet size, droplet number per pixel, scan speed of the head, or combinations thereof.

The head preferably moves in a linear and reciprocating motion along the longitudinal direction of the pixel of the substrate. Alternatively, the substrate may be moved while the head remains stationary during deposition of the organic electroluminescent material, or both the head and the substrate may be moved relative to one another during deposition of the organic electroluminescent material. Multiple passes may be made in order to fill the pixels of the entire substrate with the organic electroluminescent material.

The ink-jet process may be utilized with both polymer organic electroluminescent material, or single molecule organic electroluminescent material.

While the invention has been particularly shown and described with reference to an illustrated embodiment thereof, it will be understood by those skilled in the art that the foregoing and other changes in form and details may be made therein without departing from the spirit and scope of the invention.

What is claimed is:

1. An organic electroluminescent device, comprising:
   a transparent substrate having at least first, second, third, fourth and fifth pixels defined thereon;
   a first longitudinal bank located between said first pixel and said second;
   a second longitudinal bank located between said second pixel and said third;
   an organic luminous polymer layer over said substrate and between said first longitudinal bank and said second longitudinal bank;
   a first transverse bank extending between said first longitudinal bank and said second longitudinal bank and located between said fourth pixel and said second pixel, said first transverse bank having a height less than a height of said first and second longitudinal banks;
   a second transverse bank extending between said first longitudinal bank and said second longitudinal bank and located between said second pixel and said fifth pixel, said second transverse bank having a height less than a height of said first and second longitudinal banks; and
   a plurality of first electrodes formed over said substrate, each of said first, second, third, fourth and fifth pixels being associated with a respective one of said first electrodes, wherein the plurality of first electrodes are divided along a longitudinal direction by the first transverse bank and second transverse bank,
   wherein the organic luminous polymer layer is separated from a neighboring organic luminous polymer layers by the first transverse bank and the second transverse bank, and
   wherein sidewalls of each of said first and second longitudinal banks extending from a top of said first and second longitudinal banks are sloped and continuously become wider toward said transparent substrate.

2. The organic electroluminescent device according to claim 1, wherein a slope of said sidewall is linear.

3. The organic electroluminescent device according to claim 1, wherein a slope of said sidewalls is non-linear such that said sidewalls are arcuate.

4. The organic electroluminescent device according to claim 1, wherein said sidewalls of said first longitudinal bank taper to a point at a top of said first longitudinal bank and said sidewalls of said second longitudinal bank taper to a point at a top of said second longitudinal bank.

5. The organic electroluminescent device according to claim 1, wherein tops of said first and said second longitudinal banks are flat.

6. The organic electroluminescent device according to claim 1, wherein said first and said second longitudinal banks have one of a trapezoidal cross-sectional shape, a triangular cross-sectional shape, and a semi-parabolic cross-sectional shape.

7. The organic electroluminescent device according to claim 1, wherein sidewalls of said first transverse bank and said second transverse bank are sloped and continuously become wider toward said transparent substrate.

8. The organic electroluminescent device according to claim 1, wherein said second pixel is bounded by said first longitudinal bank, said second longitudinal bank, said first transverse bank and said second transverse bank.

9. The organic electroluminescent device according to claim 1, further comprising:
   a second electrode formed over said organic luminous polymer layer.

10. The organic electroluminescent device according to claim 9, further comprising:
    a plurality of thin film transistors formed over said substrate, each of said first, second and third pixels being associated with a respective one of said thin film transistors.

11. The organic electroluminescent device according to claim 1, wherein each of said first, second and third pixels includes an organic luminous polymer layer, said organic luminous polymer layers emitting red, green and blue light at said first, second and third pixels, respectively.

12. The organic electroluminescent device according to claim 1, wherein said first electrode of said first pixel and said first electrode of said second pixel is not in contact with said first longitudinal bank.

13. The organic electroluminescent device according to claim 1, wherein said second transverse bank has a height different from a height of said first transverse bank.

14. The organic electroluminescent device according to claim 1, wherein entire sidewalls of each of said first and second longitudinal banks are sloped and continuously become wider toward said transparent substrate.

15. An organic electroluminescent device, comprising:
    a transparent substrate having at least first, second, third, fourth and fifth pixels defined thereon;
    a first longitudinal bank located between said first pixel and said second pixel;
    a second longitudinal bank located between said second pixel and said third pixel;
    a first transverse bank extending between said first longitudinal bank and said second longitudinal bank and located between said fourth pixel and said second pixel;

an organic luminous polymer layer over said substrate and between said first longitudinal bank and said second longitudinal bank; and a plurality of first electrodes formed over said substrate, each of said first, second, third, fourth and fifth pixels being associated with a respective one of said first electrodes, wherein the plurality of first electrodes are divided along a longitudinal direction by the first transverse bank, wherein said first transverse bank has a height which is less than a height of said first longitudinal bank, wherein the organic luminous polymer layer of the second pixel is separated from a neighboring organic luminous polymer layer of the fourth pixel by the first transverse bank, and wherein sidewalls of each of said first and second longitudinal banks extending from a top of said first and second longitudinal banks are sloped and continuously become wider toward said transparent substrate.

16. The organic electroluminescent device according to claim 15, wherein sidewalls of said first transverse bank are sloped and continuously become wider toward said transparent substrate.

17. The organic electroluminescent device according to claim 15, wherein a slope of said sidewalls is linear.

18. The organic electroluminescent device according to claim 15, wherein a slope of said sidewalls is non-linear such that said sidewalls are arcuate.

19. The organic electroluminescent device according to claim 15, wherein said sidewalls of said first longitudinal bank taper to a point at a top of said first transverse bank and said sidewalls of said second longitudinal bank taper to a point at a top of said second longitudinal bank.

20. The organic electroluminescent device according to claim 15, wherein a top of said first transverse bank is flat.

21. The organic electroluminescent device according to claim 15, wherein said first transverse bank has one of a trapezoidal cross-sectional shape, a triangular cross-sectional shape, and a semi-parabolic cross-sectional shape.

22. The organic electroluminescent device according to claim 15, further comprising a second transverse bank extending between said first longitudinal bank and said second longitudinal bank and located between said second pixel and said fifth pixel, wherein the organic luminous polymer layer of the second pixel is separated from a neighboring organic luminous polymer layer of the fifth pixel by the second transverse bank, wherein said second pixel is bounded by said first longitudinal bank, said second longitudinal bank, said first transverse bank and said second transverse bank.

23. The organic electroluminescent device according to claim 15, further comprising:

a second electrode formed over said organic luminous polymer layer.

24. The organic electroluminescent device according to claim 23, further comprising:

a plurality of thin film transistors formed over said substrate, each of said first, second and third pixels being associated with a respective one of said thin film transistors.

25. The organic electroluminescent device according to claim 15, wherein each of said first, second and third pixels includes an organic luminous polymer layer, said organic luminous polymer layers emitting red, green and blue light at said first, second and third pixels, respectively.

26. The organic electroluminescent device according to claim 15, wherein said first electrode of said first pixel and said first electrode of said second pixel is not in contact with said first longitudinal bank.

27. The organic electroluminescent device according to claim 15, wherein entire sidewalls of each of said first and second longitudinal banks are sloped and continuously become wider toward said transparent substrate.

28. An organic electroluminescent device, comprising:

a transparent substrate having at least first, second, third, fourth and fifth pixels defined thereon, a first electrode of said first pixel, a first electrode of said second pixel, a first electrode of said third pixel, a first electrode of said fourth pixel, and a first electrode of said fifth pixel being formed on said transparent substrate;

a first longitudinal bank located between said first pixel and said second pixel, said first electrode of said first pixel and said first electrode of said second pixel not contacting said first longitudinal bank;

a second longitudinal bank located between said second pixel and said third pixel; an organic luminous polymer layer over said substrate and between said first longitudinal bank and said second longitudinal bank; and a first transverse bank extending between said first longitudinal bank and said second longitudinal bank and located between said fourth pixel and said second pixel, said first transverse bank having a height less than a height of said first longitudinal bank, wherein the first electrode of said fourth pixel and the first electrode of said second pixel are divided along a longitudinal direction by the first transverse bank, wherein the organic luminous polymer layer of the second pixel is separated from a neighboring organic luminous polymer layer of the fourth pixel by the first transverse bank, and wherein sidewalls of each of said first and second longitudinal banks extending from a top of said first and second longitudinal banks are sloped and continuously become wider toward said transparent substrate.

29. The organic electroluminescent device according to claim 28, wherein a slope of said sidewalls is linear.

30. The organic electroluminescent device according to claim 28, wherein a slope of said sidewalls is non-linear such that said sidewalls are arcuate.

31. The organic electroluminescent device according to claim 28, wherein said sidewalls of said first longitudinal bank taper to a point at a top of said first longitudinal bank and said sidewall of said second longitudinal bank taper to a point at a top of said second longitudinal bank.

32. The organic electroluminescent device according to claim 28, wherein tops of said first and said second longitudinal banks are flat.

33. The organic electroluminescent device according to claim 28, wherein said first and said second longitudinal banks have one of a trapezoidal cross-sectional shape, a triangular cross-sectional shape, and a semi-parabolic cross-sectional shape.

34. The organic electroluminescent device according to claim 28, wherein sidewalls of said first transverse bank are sloped and continuously become wider toward said transparent substrate.

35. The organic electroluminescent device according to claim 28, further comprising a second transverse bank extending between said first longitudinal bank and said second longitudinal bank and located between said second pixel and said fifth pixel, wherein the organic luminous polymer layer of the second pixel is separated from a neighboring organic luminous polymer layer of the fifth pixel by the second transverse bank, wherein said second pixel is bounded by said first longitudinal bank, said second longitudinal bank, said first transverse bank and said second transverse bank.

36. The organic electroluminescent device according to claim 28, further comprising:
a second electrode formed over said organic luminous polymer layer.

37. The organic electroluminescent device according to claim 36, further comprising:
a plurality of thin film transistors formed over said substrate, each of said first, second and third pixels being associated with a respective one of said thin film transistors.

38. The organic electroluminescent device according to claim 28, wherein each of said first, second and third pixels includes an organic luminous polymer layer, said organic luminous polymer layers emitting red, green and blue light at said first, second and third pixels, respectively.

39. The organic electroluminescent device according to claim 28, wherein entire sidewalls of each of said first and second longitudinal banks are sloped and continuously become wider toward said transparent substrate.

* * * * *